United States Patent
Lee

(10) Patent No.: US 8,610,447 B2
(45) Date of Patent: Dec. 17, 2013

(54) SPRING STRUCTURE AND TEST SOCKET USING THEREOF

(75) Inventor: Jae Hak Lee, Seoul (KR)

(73) Assignee: ISC Co., Ltd., Gyeonggi-do (KR)

( * ) Notice: Subject to any disclaimer, the term of this patent is extended or adjusted under 35 U.S.C. 154(b) by 300 days.

(21) Appl. No.: 13/054,680

(22) PCT Filed: Jul. 20, 2009

(86) PCT No.: PCT/KR2009/004012
§ 371 (c)(1), (2), (4) Date: Jan. 18, 2011

(87) PCT Pub. No.: WO2010/008257
PCT Pub. Date: Jan. 21, 2010

(65) Prior Publication Data
US 2011/0121850 A1    May 26, 2011

(30) Foreign Application Priority Data

Jul. 18, 2008  (KR) .................. 10-2008-0070082
Aug. 20, 2008  (KR) .................. 10-2008-0081372

(51) Int. Cl.
*G01R 31/00*    (2006.01)

(52) U.S. Cl.
USPC ..................... 324/756.02; 439/66

(58) Field of Classification Search
USPC ........ 324/756.02; 248/618, 624, 625; 268/85, 268/86, 168, 238
See application file for complete search history.

(56) References Cited

U.S. PATENT DOCUMENTS

| | | | | |
|---|---|---|---|---|
| 1,305,042 | A  * | 5/1919 | White ........................... | 248/576 |
| 2,879,960 | A  * | 3/1959 | Mortimer ...................... | 248/560 |
| 2,949,324 | A  * | 8/1960 | Birge et al. ................... | 403/229 |
| 5,014,004 | A  * | 5/1991 | Kreibich et al. ......... | 324/755.05 |
| 6,174,174 | B1 * | 1/2001 | Suzuki et al. .................. | 439/71 |
| 6,341,962 | B1 * | 1/2002 | Sinclair .......................... | 439/66 |
| 6,404,301 | B1 * | 6/2002 | Park et al. ..................... | 333/182 |
| 6,439,897 | B1 * | 8/2002 | Ikeya ............................. | 439/73 |
| 2003/0016037 | A1 * | 1/2003 | Kazama ......................... | 324/754 |
| 2003/0137316 | A1 * | 7/2003 | Kazama ......................... | 324/761 |

FOREIGN PATENT DOCUMENTS

| | | |
|---|---|---|
| KR | 10-2002-0035864 | 5/2002 |
| KR | 10-2007-0064883 | 6/2007 |
| KR | 10-2008-0015512 | 2/2008 |

* cited by examiner

*Primary Examiner* — Melissa Koval
*Assistant Examiner* — Stephen G Armstrong
(74) *Attorney, Agent, or Firm* — Nixon & Vanderhye, PC

(57) ABSTRACT

Spring assemblies and a test socket using the spring assemblies. The spring assemblies are used in a test socket electrically connecting lead terminals of a semiconductor chip to test terminals of a test device by contacting the lead terminals and the test terminals, and include: first springs in which a first steel wire having elasticity and conductivity is coiled in a spiral in one direction; and second springs in which a second steel wire having elasticity and conductivity is coiled in a spiral in an opposite direction to the direction in which the first springs are coiled, which have outer diameters narrower than inner diameters of the first springs, and are inserted into the first springs. Accordingly, electric resistances and inductances of two spring assemblies coiled in a spiral are reduced to improve electricity transmission characteristic. A height of a test socket is easily adjusted using spring assemblies having desired lengths. Also, since only plating is performed on the springs to form the spring assemblies, the spring assemblies are formed at a very low cost and have a wide range of applications.

14 Claims, 14 Drawing Sheets

US 8,610,447 B2

SPRING STRUCTURE AND TEST SOCKET USING THEREOF

This application is the U.S. national phase of International Application No. PCT/KR2009/004012, filed 20 Jul. 2009, which designated the U.S. and claims priority to Korean Application No(s). 10-2008-0070082, filed 18 Jul. 2008 and 10-2008-0081372, filed 20 Aug. 2008, the entire contents of each of which are hereby incorporated by reference.

TECHNICAL FIELD

The present invention relates to spring assemblies and a test socket using the same, and more particularly, to spring assemblies which include first springs and second springs inserted into the first springs and have improved electricity transmission characteristics and a test socket using the same.

BACKGROUND ART

In general, when a process of manufacturing a semiconductor chip such as an integrated circuit (IC) or the like is ended, an electric performance, a poor quality, etc., of the semiconductor chip are tested. When the semiconductor chip is tested, a test socket is provided between a test device and the semiconductor chip to electrically connect lead terminals of the semiconductor chip to test terminals of the test device. A current flows from the test terminals of the test device into the lead terminals of the semiconductor chip through the test socket, and signals respectively output from the lead terminals are analyzed to determine whether the semiconductor chip is abnormal.

As shown in FIG. 1, a conventional test socket is installed on a test device 20 and includes pogo pins 50 and a housing 30 that supports the pogo pins 50.

The housing 30 has through-holes formed in positions corresponding to test terminals 22 of the test device 20 and lead terminals 12 of a semiconductor chip 10, and the pogo pins 50 are respectively installed in the through-holes to electrically connect the lead terminals 12 to the test terminals 22.

The pogo pins 50 include barrels 52, upper plungers 54, lower plungers 56, and springs 58. The upper and lower plungers 54 and 56 are respectively connected to the lead terminals 12 of the semiconductor chip 10 and the test terminals 22 of the test device 20. The springs 58 are disposed between the upper and lower plungers 54 and 56 and provide elasticity and electric conductivity. The barrels 52 support and enclose the upper and lower plungers 54 and 56 and the springs 58.

The pogo pins 50 have serial structures of the upper plungers 54, the barrels 52, and the lower plungers 56. Since the pogo pins 50 also include the springs 58, manufacturing heights of the pogo pins 50 are greatly limited. Also, since the pogo pins 50 have wide areas as a whole, mutual inductance and capacitance between the adjacent pogo pins 50 increase. As a result, lengths and magnetic inductance values of the pogo pins 50 increase due to the springs 58, thereby deteriorating signal (electricity) transmission characteristics.

A semiconductor chip which includes lead terminals having narrow distances from one another and thus has a fine pitch has been developed. Therefore, a pitch of a test socket is also narrowed. However, it is not easy to reduce distances between barrels of conventional pogo pins and to form metal plating layers in the barrels.

Also, manufacturing cost of a test socket is very high due to micromachining of the upper and lower plungers 54 and 56 and the barrels 52 of the pogo pins 50.

In order to solve these problems, a technique for using a single spring in a test socket, as shown in FIG. 2, has been applied. In other words, the test socket is mounted on a test device 20 and includes spring pins 70 having spring shapes and a housing 30 that supports the spring pins 70.

Through-holes 60 are respectively formed in positions of the housing 30 corresponding to test terminals 22 of the test device 20 and lead terminals 12 of a semiconductor chip 10. The spring pins 70 are respectively installed in the through-holes 60 to electrically connect the lead terminals 12 to the test terminals 22.

A metal steel wire is coiled in a spiral to form the spring pins 70. Manufacturing cost of the spring pins 70 is less than that of the pogo pins 50 illustrated with reference to FIG. 1. However, when testing the semiconductor chip 10, the spring pins 70 generate a circulating current and thus have inductances, thereby deteriorating signal transmission characteristics of the spring pins 70. Also, if lengths of the spring pins 70 lengthen with an increase in a height of the test socket, it is difficult to maintain the shapes of the spring pins 70.

In addition, if compression and extension are repeated in a repetitive test process, a fatigue failure occurs.

DETAILED DESCRIPTION OF THE INVENTION

Technical Problem

The present invention provides spring assemblies which are manufactured at a low cost, have improved electricity transmission characteristics, and have unlimited manufacturing heights, and a test socket using the same.

Technical Solution

According to an aspect of the present invention, there is provided spring assemblies used in a test socket electrically connecting lead terminals of a semiconductor chip to test terminals of a test device, including: first springs in which a first steel wire having elasticity and conductivity is coiled in a coil spiral in one direction; and second springs in which a second steel wire having elasticity and conductivity is coiled in a spiral in an opposite direction to the direction in which the first springs are coiled and which have outer diameters narrower than inner diameters of the first spring and are inserted into the first springs.

According to another aspect of the present invention, there is provided a test socket including the spring assemblies, including: a housing which includes a plurality of through-holes formed in positions corresponding to the lead terminals of the semiconductor and supports the spring assemblies inserted into the plurality of through-holes.

According to another aspect of the present invention, there is provided spring assemblies used in a test socket and compressed when lead terminals of a semiconductor chip press the spring assemblies, to electrically connect the lead terminals of the semiconductor chip to test terminals of a test device, including: first springs in which a first steel wire having conductivity is coiled in a spiral and which include first contacting parts in which the first steel wire is densely coiled so that coils thereof contact one another and first elastic parts in which the first steel is coiled so that coils thereof maintain distances from one another; and second springs in which a second steel wire having conductivity is coiled in a spiral and which include second contacting parts in which the second steel is coiled so that coils thereof contact one another and second elastic parts in which the second steel wire is coiled so that coils thereof maintain distances from one another, wherein the first contacting parts face the second elastic parts, and the first elastic parts face the second contacting parts.

A test socket including the spring assemblies, including: a housing which includes a plurality of through-holes formed in positions corresponding to the lead terminals and supports the spring assemblies inserted into the through-holes.

Advantageous Effects

A spring assembly according to the present invention forms two current paths due to two springs to reduce an electric resistance when a semiconductor device is tested.

Since the two springs are coiled in a spiral in opposite directions, inductances generated by the two springs are offset from each other. Therefore, an overall inductance is reduced more than when only one spring is used.

The spring assembly simply adjusts a height of a test socket using springs having desired lengths, and only plating is performed on first and second springs to form the spring assembly. Therefore, manufacturing cost of the spring assembly is very low, and the spring assembly has a wide range of applications. Also, the two springs disperse a pressure applied when the semiconductor chip is tested, thereby improving durability of the two springs.

The spring assembly rapidly transmits an electric signal through contacting parts of the two springs when the semiconductor chip is tested to thus improve a signal transmission characteristic.

The spring assembly simply adjusts the height of the test socket using springs formed to desired lengths, and two springs are formed through only plating. Therefore, manufacturing cost of the spring assembly is very low, and the spring assembly has a wide range of applications. The two springs disperse the pressure applied when the semiconductor chip is tested to thus improve durability of each of the springs.

BEST MODE

Figure 1:
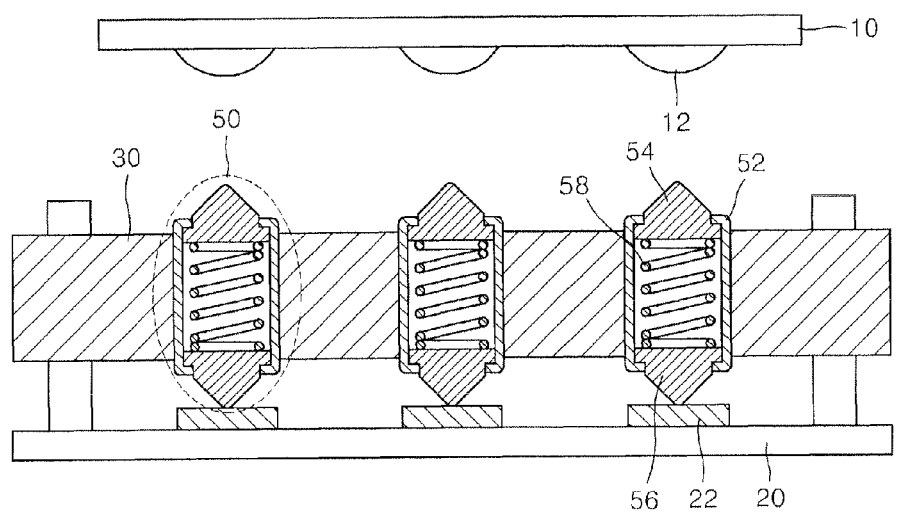
FIG. 1 is a cross-sectional view illustrating a conventional test socket.
Figure 2:
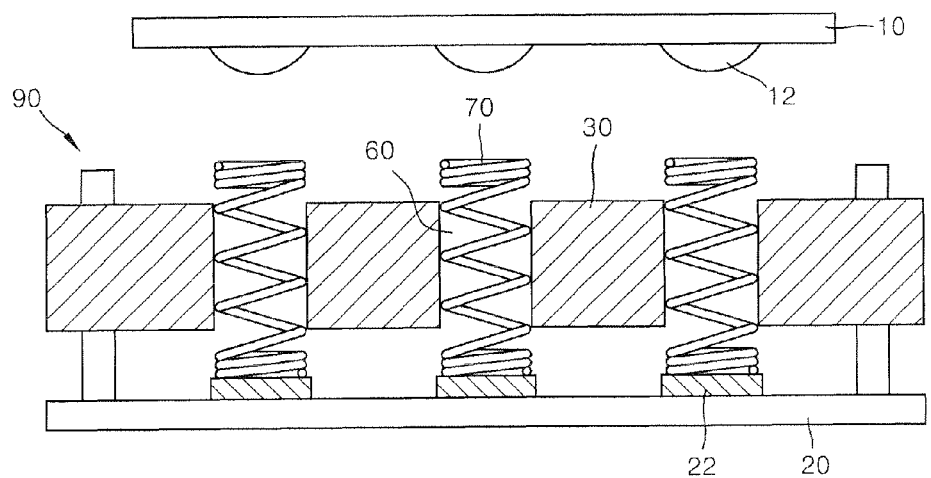
FIG. 2 is a cross-sectional view illustrating another conventional test socket.

The present invention will now be described more fully with reference to the accompanying drawings, in which exemplary embodiments of the invention are shown. Like reference numerals in the drawings denote like elements.

Figure 3:
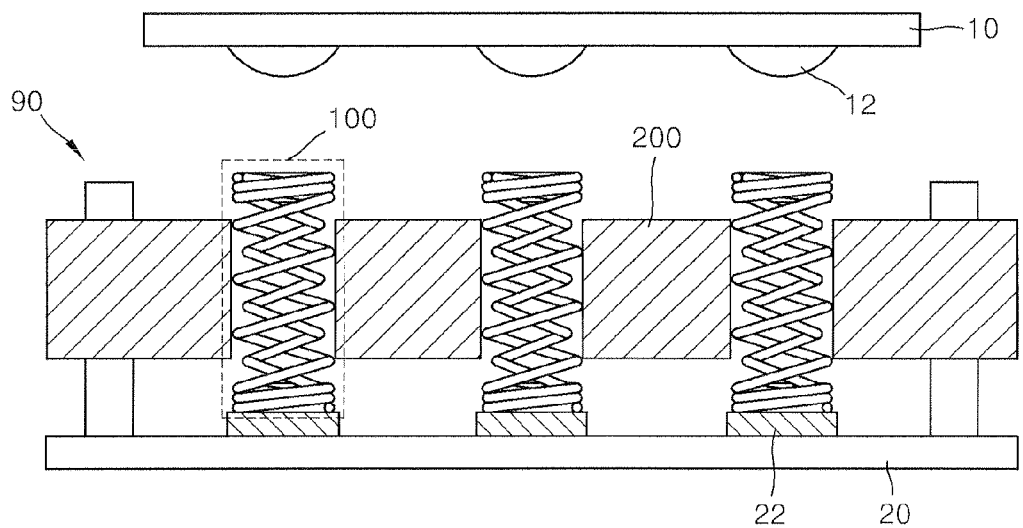
FIG. 3 is a cross-sectional view illustrating spring assemblies and a test socket using the spring assemblies according to an embodiment of the present invention.

FIG. 3 is a cross-sectional view illustrating spring assemblies 100 and a test socket 90 using the spring assemblies 100 according to an embodiment of the present invention.

Referring to FIG. 3, the spring assemblies 100 are used in the test socket 90 which electrically connects lead terminals 12 of a semiconductor chip 10 to test terminals 22 of a test device 20. The spring assemblies 100 respectively contact the lead terminals 12 of the semiconductor chip 10 and the test terminals 22 of the test device 20 so as to test the semiconductor chip 10.

Figure 4A:
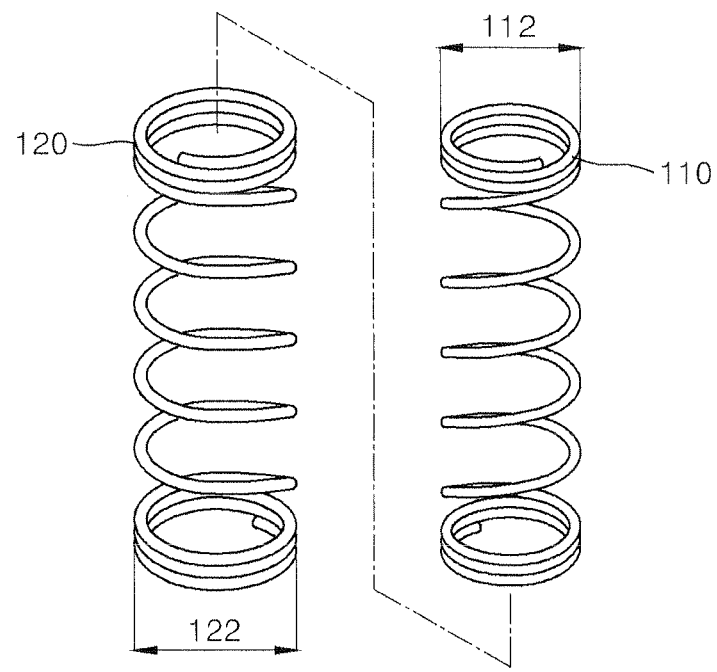
FIG. 4A illustrates a structure of a spring assembly according to an embodiment of the present invention.
Figure 4B:
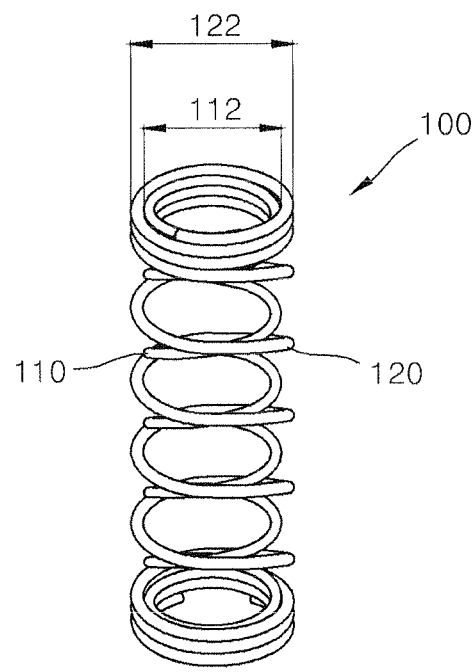
FIG. 4B illustrates the spring assembly according to the embodiment of the present invention.

FIG. 4A illustrates a structure of a spring assembly 100 according to an embodiment of the present invention, and FIG. 4B illustrates the spring assembly 100 according to the embodiment of the present invention.

Referring to FIGS. 4A and 4B, the spring assembly 100 includes first and second springs 120 and 110.

The first and second springs 120 and 110 have elasticity and electric conductivity and are respectively inserted and disposed into a plurality of through-holes formed in a housing 200 of the test socket 90 to be described below. The first and second springs 120 and 110 may be formed of a metal material having high electric conductivity and elasticity, such as iron (Fe), nickel (Ni), or the like, or may be formed of a metal alloy having high electric conductivity and elasticity.

For elasticity and electric conductivity, the first spring 120 is formed of a first steel wire having an elastic force. In other words, the first steel wire is coiled in a spiral to form the first spring 120. The first steel wire is formed of a thin metal wire or a thin alloy wire. An outer diameter of the first spring 120 is narrower than an inner diameter of a through-hole so that the first spring 120 is insertable into the through-hole of the housing 200. The first spring 120 may have upper, middle, and lower parts having the same diameters. However, the diameters of the upper and lower parts of the first springs 120 respectively contacting the lead terminals 12 and the test terminals 22 may be narrower than the diameters of the middle parts of the first springs 120.

For elasticity and electric conductivity, the second spring 110 is formed of a second steel wire having an elastic force. In other words, the second steel wire is coiled in a spiral to form the second spring 110. The second steel is formed of a thin metal wire or a thin alloy wire. The second spring 110 may be coiled in a spiral in an opposite direction to that in which the first spring 120 is coiled.

Upper, middle, and lower parts of the second spring 110 may have the same diameters. However, the diameters of the upper and lower parts of the second springs 110 respectively contacting the lead terminals 12 and the test terminals 22 may be narrower than the diameters of the middle parts of the second springs 110.

The first and second springs 120 and 110 include contacting parts (not shown) and elastic parts (not shown). The contacting parts refer to upper and lower parts of the first and second springs 120 and 110 in which gaps between coils are narrow, and thus adjacent coils finely contact one another. The elastic parts refer to parts between the upper and lower parts of the first and second springs 120 and 110 in which gaps between coils are wider than those of the contacting parts. As will be described later, the coil of the second spring 110 is coiled in an opposite direction to that in which the coil of the first spring 120 is coiled, to offset an inductance generated when a current flows in the first spring 120. The coil gaps of the elastic parts of the first and second springs 120 and 110 may be equal to one another.

Referring to FIG. 4B, the second spring 110 is inserted into the first spring 120.

An outer diameter 112 of the second spring 110 is narrow than an inner diameter 122 of the first spring 120 to insert the second spring 110 into the first spring 120.

Lengths of the first and second springs 120 and 110 may be equal to each other to disperse a pressure when the semiconductor chip 10 is tested. The upper and lower parts of the first and second springs 120 and 110 may contact each other and may be soldered together to be electrically connected to each other. In order to prevent an electricity flow from being complicated, the spring assembly 100 may be formed so that only the contacting parts of the first and second springs 120 and 110 are soldered together and the elastic parts of the first and second springs 120 and 110 do not contact each other.

When the number of coiling of the first spring 120 is N1, and the number of coiling of the second spring 110 is N2, the numbers N1 and N2 may be 0.3≤N1/N2≤3.0, 0.8≤N1/N2≤1.2, or N1=N2. In other words, the numbers N1 and N2 may be N1=N2 to easily offset mutual inductances. However, although the numbers N1 and N2 are slightly different from each other, an offset effect of the inductance may be sufficiently obtained. However, if N1/N2<0.3 or N1/N2>3.0, it is difficult to sufficiently obtain the offset effect of the inductance due to a large difference between the numbers N1 and N2. Also, it is difficult to increase one of the numbers N1 and N2 if the diameters of the first and second springs 120 and 110 are narrow.

Two current paths are formed through the first and second springs 120 and 110 when the semiconductor chip 10 is tested, thereby reducing a resistance of the spring assembly 100 by about 50% more than when the spring assembly 100 includes only one spring.

Coiling directions of the first and second springs 120 and 110 of the spring assembly 100 are opposite to each other, inductances generated by the first and second springs 120 and 110 are offset from each other and thus wholly decrease more than when the spring assembly 100 includes only one spring.

The spring assembly 100 includes only springs and thus occupies a smaller area than conventional pogo pins. If the spring assemblies 100 are arranged side-by-side at fixed distances from one another in a test socket, facing areas of adjacent springs decrease, thereby reducing capacitance.

Also, when the first and second springs 120 and 110 are compressed between the semiconductor chip 10 and the test device 20 due to testing of the semiconductor chip 10, the pressure is dispersed the first and second springs 120 and 110. Therefore, durability of the first and second springs 120 and 110 is greater than when the spring assembly 100 includes one spring.

The first and second springs 120 and 110 include plating layers formed of at least one of Ni, Fe, copper (Cu), gold (Au), aluminum (Al), and silver (Ag). Cu and Au may be sequentially plated on surfaces of the first and second springs 120 and 110. Besides Au, various types of metals, such as Ag, etc., may be used as plating materials. The plating layers having high conductivity are formed on the surfaces of the first and second springs 120 and 110, thereby improving an electricity transmission characteristic of the spring assembly 100.

The spring assembly 100 according to the present embodiment may be formed using springs which may be formed to desired lengths, thereby adjusting a height of a test socket. Also, since only plating is performed with respect to the first and second springs 120 and 110, the spring assembly 100 is very cheap and has a wide range of applications. For example, the spring assembly 100 may be used instead of conventional pogo pins in the test socket to be described below and may be used instead of conventional springs inserted into barrels of the conventional pogo pins. Therefore, the spring assembly 100 has a wide arrange of applications.

Figure 5A:
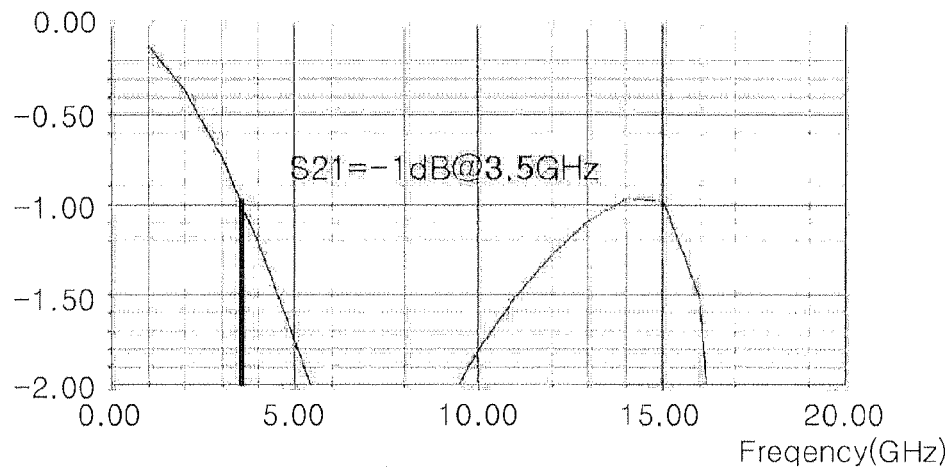
FIG. 5A is a graph illustrating a result obtained by testing a signal transmission characteristic using the conventional test socket of FIG. 2.
Figure 5B:
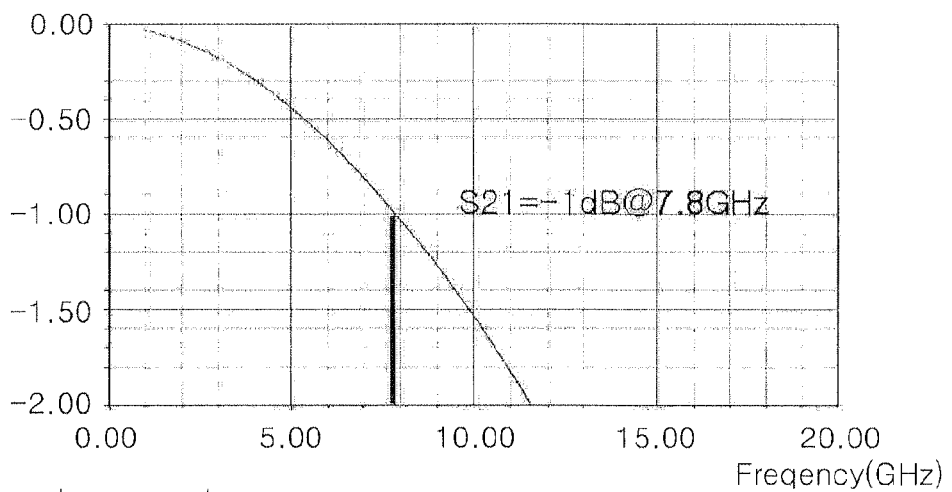
FIG. 5B is a graph illustrating a result obtained by testing a signal transmission characteristic using a spring assembly including two springs coiled in the same direction.
Figure 5C:
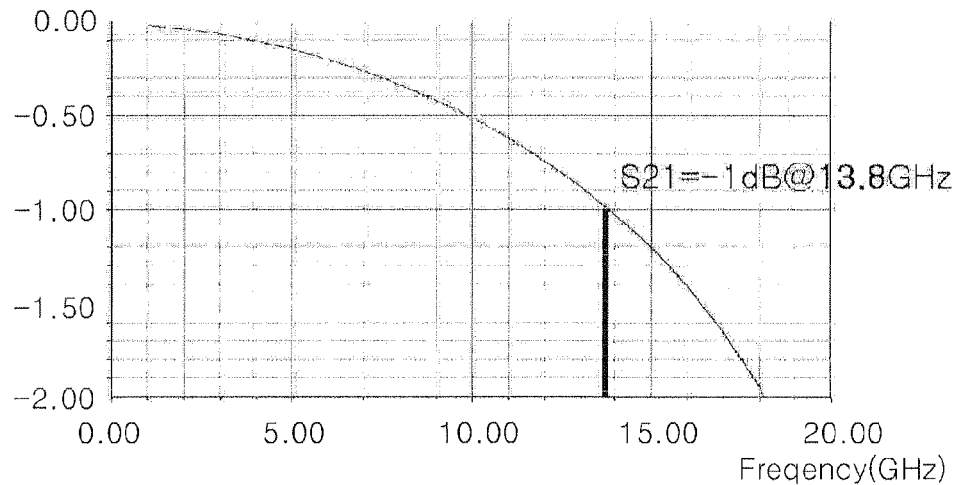
FIG. 5C is a graph illustrating a result obtained by testing a signal transmission characteristic using the test socket of FIG. 3.

FIGS. 5A, 5B, and 5C respectively are graphs illustrating result values of a comparison of frequency characteristics of a single spring, a dual spring (in which two springs are coiled in the same direction), and a dual spring (in which two springs are coiled in opposite directions).

The comparison result values are obtained using scattering parameters (S parameters) which indicate a power ratio between input and output ports. Here, a factor S21 indicates that a second port (an output signal) outputs a signal without loss in comparison with a first port (an input signal). In other words, if a result "0 dB" is output at a frequency, this result indicates that an input signal has reached an output port without any loss. However, since any high-quality material is not perfect in reality, −1 dB becomes a criterion. According to the presented result, as shown in FIG. 5A, in the case of the single spring, an input signal is transmitted to an output port with loss of −1 dB at a frequency of 3.5 GHz. As shown in FIG. 5B, in the case of the dual spring in which the two springs are coiled in the same direction, an input signal is transmitted to an output port with loss of −1 dB at a frequency of 7.8 GHz. In the case of the dual spring in which the two springs are coiled in the opposite directions according to the present invention, an input signal is transmitted to an output port with loss of −1 dB and to the another output port with loss of −1 dB at a frequency of 13.8 GHz. As described above, the dual spring transmits a signal at a higher frequency than the single spring. Also, the dual spring having the two springs coiled in the opposite directions transmits the signal at a higher frequency than the dual spring having the two springs coiled in the same direction.

Referring back to FIG. 3, the test socket 90 according to the present invention includes the spring assemblies 100 and the housing 200. The spring assemblies 100 are as described above, and thus, their detailed descriptions will be omitted herein.

The test socket 90 is mounted on the test device 20 to be connected to the semiconductor chip 10 which is conveyed by a handler device or the like. In more detail, when the semiconductor chip 10 is conveyed by the handler device downwards, the lead terminals 12 of the semiconductor chip 10 contact the upper parts of the spring assemblies 100. Therefore, the semiconductor chip 10 is pressed down by a pressurizer (not shown), thereby electrically connecting the lead terminals 12 of the semiconductor chip 10 to the test terminals 22 of the test device 20 via the spring assemblies 100.

The housing 200 supports the spring assemblies 100 and has a plurality of through-holes formed in positions corresponding to the lead terminals 12 of the semiconductor chip 10 or the test terminals 22 of the test device 20. The housing 200 may be formed of FR4, FR5, bakelite, or the like or may be formed of a synthetic resin material such as a printed circuit board (PCB)-forming material or engineering plastic having a high heat-resistant property. The through-holes formed in the housing 200 have the same diameters in upward and downward directions and may be simply formed using a drill or the like.

The spring assemblies 100 are respectively inserted and disposed into the through-holes. Inner diameters of the through-holes are wider than outer diameters of the first springs 120 of the spring assemblies 100 so as to insert the spring assemblies 100 into the through-holes of the housing 200.

The spring assemblies 100 of the test socket 90 provide elastic forces when being pressed for testing the semiconductor chip 10 to improve contact characteristics between the lead terminals 12 of the semiconductor chip 10 and the test terminals 22 of the test device 20. Also, even if the lead terminals 12 of the semiconductor chip 10 or the test terminals 22 of the test device 20 have different positions or heights, the spring assemblies 100 improve the contact characteristics between the lead terminals 12 and the test terminals 22.

Figure 6:
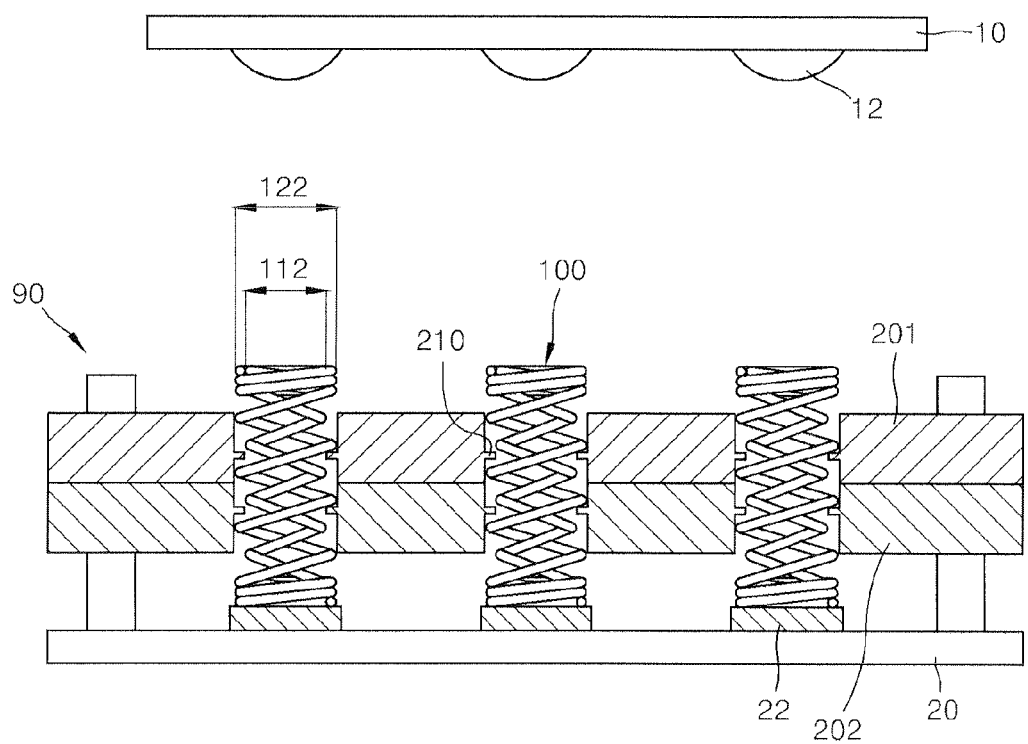
FIG. 6 is a cross-sectional view illustrating a test socket using spring assemblies of FIG. 3, according to an embodiment of the present invention.

FIG. 6 is a cross-sectional view illustrating a test socket 90 using the spring assemblies 100 of FIG. 3, according to an embodiment of the present invention.

The test socket 90 according to the present embodiment includes the spring assemblies 100, a housing, and anti-escaping parts 210. The spring assemblies 100 and the housing 200 are as described above, and thus, their detailed descriptions will be omitted herein.

Referring to FIG. 6, in the test socket 90, upper and lower housings 201 and 202 include the anti-escaping parts 210 which prevent the spring assemblies 100 from escaping from through-holes of the upper and lower housings 201 and 202.

The housing may be formed of a single body or may be formed of the upper and lower housings 201 and 202 as shown in FIG. 6. The upper housing 201 or the lower housing 202 has the anti-escaping parts 210. The anti-escaping parts 210 in each of the through-holes may be formed of at least one or more protrusions, and thus the spring assemblies 100 catch on the protrusions not to escape from the through-holes.

The anti-escaping parts 210 prevent the spring assemblies 100 from escaping from the through-holes of the housing 200 and thus may be formed in various shapes. For example, to form the anti-escaping parts 210, a thin plastic board (not shown) having holes of the same size as the through-holes of the housing 200 is positioned between the upper and lower housings 201 and 202. The spring assemblies 100 are inserted into the through-holes of the upper and lower housings 201 and 202. The plastic board is pushed in so that the holes of the plastic board do not match with the through-holes of the upper and lower housings 201 and 202. The plastic board is combined with the upper and lower housings 201 and 202 using an adhesive, fasteners, or the like.

Figure 7:
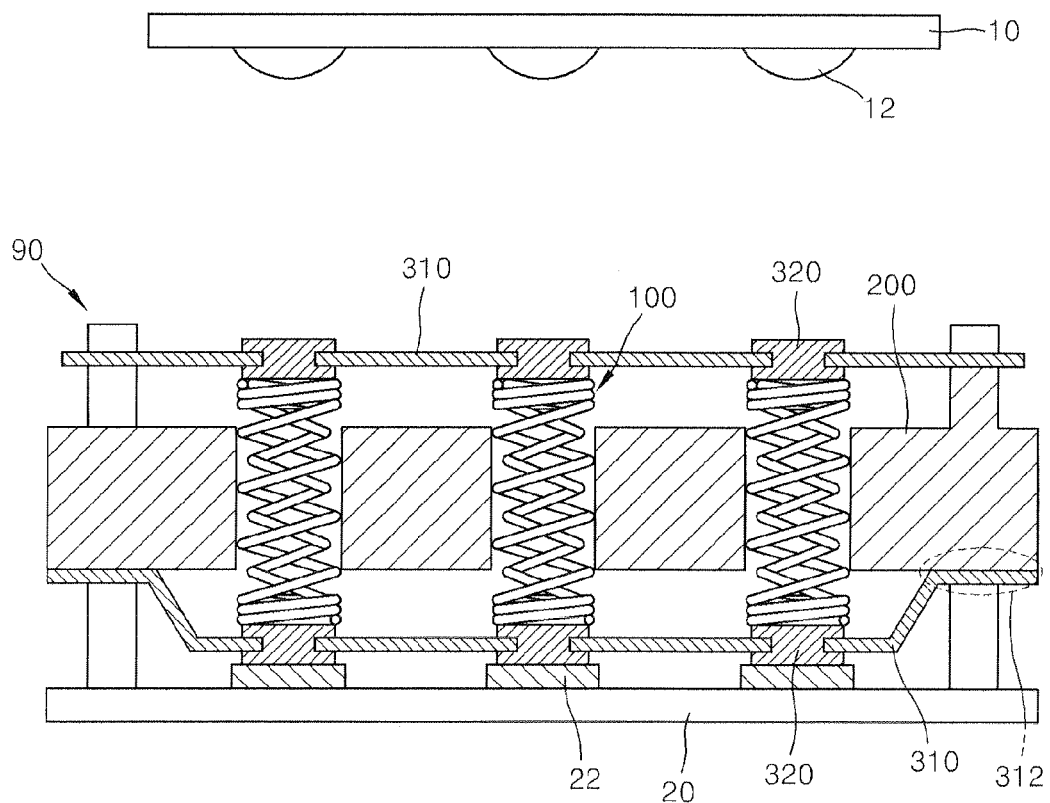
FIG. 7 is a cross-sectional view illustrating a test socket using spring assemblies, according to another embodiment of the present invention.

FIG. 7 is a cross-sectional view illustrating a test socket 90 according to another embodiment of the present invention.

Referring to FIG. 7, the test socket 90 includes a housing 200, spring assemblies 100, and contact sheets. The housing 200 and the spring assemblies 100 are as described above, and thus, their detailed descriptions will be omitted herein.

The contact sheets may be disposed between the spring assemblies 100 and a semiconductor chip 10 and/or the spring assemblies 100 and a test device 20 and includes conductive pads 320 and insulating films 310.

The insulating films 310 have a plurality of holes (not shown) so that the conductive pads 320 are disposed at positions corresponding to the spring assemblies 100. The insulating films 310 may be formed of a synthetic resin material having elasticity, such as polypropylene, polyethylene, or the like.

The conductive pads 320 are arranged in the holes of the insulating films 310 formed in the positions corresponding to the spring assemblies 100, i.e., in positions corresponding to positions in which through-holes of the housing 200 are formed. Therefore, the conductive pads 320 contact the spring assemblies 100 and electrically connect lead terminals 12 of the semiconductor chip 10 to respectively test terminals 22 of the test device 20

The conductive pads 320 may be formed of various metal materials having high electric conductivity and in structures in which Ni and gold-plated layers are formed on Cu-clad films. Also, plating layers may be formed of at least one of Ni, Fe, Cu, Au, Al, and Ag on surfaces of the conductive pads 320 to improve electric conductivity. Besides these, plating layers formed of various types of metal materials having high conductivity may be formed on the surfaces of the conductive pads 320.

Contact parts of the conductive pads 320 and the spring assemblies 100 may be soldered together so that the conductive pads 320 are attached to the spring assemblies 100. Therefore, due to this soldering, electric contact characteristics of the conductive pads 320 and the spring assemblies 100 are improved, and the spring assemblies 100 are prevented from escaping from the through-holes of the housing 200.

Also, diamond powder (not shown) and/or Ni powder (not shown) may be coated on surfaces of parts of the conductive pads 320 contacting the lead terminals 12 and/or the test terminals 22. In more detail, the diamond powder and/or the Ni powder are plated and attached to the surfaces of the conductive pads 320 due to metal plating layers of NI or a metal having high electric conductivity.

If the diamond powder is coated on the conductive pads 320, Ni powder or metal powder having high electric conductivity may be coated and plated on the surfaces of the conductive pads 320 along with the diamond powder and/or the Ni powder, thereby improving electric conductivity.

If foreign substance layers are formed on the lead terminals 12 of the semiconductor chip 10 or the test terminals 22 of the test device 20 due to coating of fine powder such as the diamond powder on the surfaces of the conductive pads 320, the fine powder such as the diamond powder may break the foreign substance layers formed on the lead terminals 12 and the test terminals 22. Therefore, the lead terminals 12 and the test terminals 22, from which the foreign substance layers have been removed by the fine powder such as the diamond powder, pass through the diamond powder and then contact the surfaces of the conductive pads 320, thereby greatly reducing an electric resistance between the lead terminal 12 and the conductive pads 320 or the test terminals 22 and the conductive pads 320.

Each of the particle diameters of the diamond powder and/or the Ni powder may be between about 0.1 µm and about 50.0 µm. If each of the particle diameters of the diamond powder and/or the Ni powder is narrower than 0.1 µm, the diamond powder and/or the Ni powder does not break the foreign substance layers. If each of the particle diameters of the diamond powder and/or the Ni powder is wider than 50.0 µm, the diamond powder and/or the Ni powder damage the surfaces of the lead terminals 12 and the test terminals 22.

The contact sheets are disposed on upper and lower parts of the spring assemblies 100 in FIG. 7 but may be disposed on the upper or lower parts of the spring assemblies 100 or on the upper and lower parts of the spring assemblies 100.

Part of the contact sheets contacting the conductive pads 320 and the spring assemblies 100 may be soldered on the conductive pads 320 and the spring assemblies 100. Also, as shown in FIG. 7, edges (ends) of the insulating films 310 are combined or joined with the housing 200 using a method such as adhering or fastening. Only the ends of the insulating films 310 are combined or joined with the housing 200 as shown in FIG. 7, or all parts of the insulating films 310 contacting the housing 200 may be combined or joined with the housing 200. In other words, the insulating films 310 may be combined or joined with the housing 200 using various methods.

In the contact sheets used in the test socket 90, the conductive pads 320 contacting the lead terminals 12 of the semiconductor chip 10 or the test terminals 22 of the test device 20 are connected to one another through the insulating films 310. Therefore, the foreign substance layers formed on the lead terminals 12 of the semiconductor chip 10 or the test terminals 22 of the test device 20 do not enter the through-holes of the housing 200. Also, left and right positions of the conductive pads 320 are maintained by the insulating films 310. If cross-sectional areas of the conductive pads 320 which contact the lead terminals 12 or the test terminals 22 are increased, surface areas of the conductive pads 320 which respectively contact the lead terminals 12 or the test terminals 22 are increased. Thus, electric contacts are easily achieved, and the spring assemblies 100 are prevented from escaping from the through-holes of the housing 200.

Figure 8:
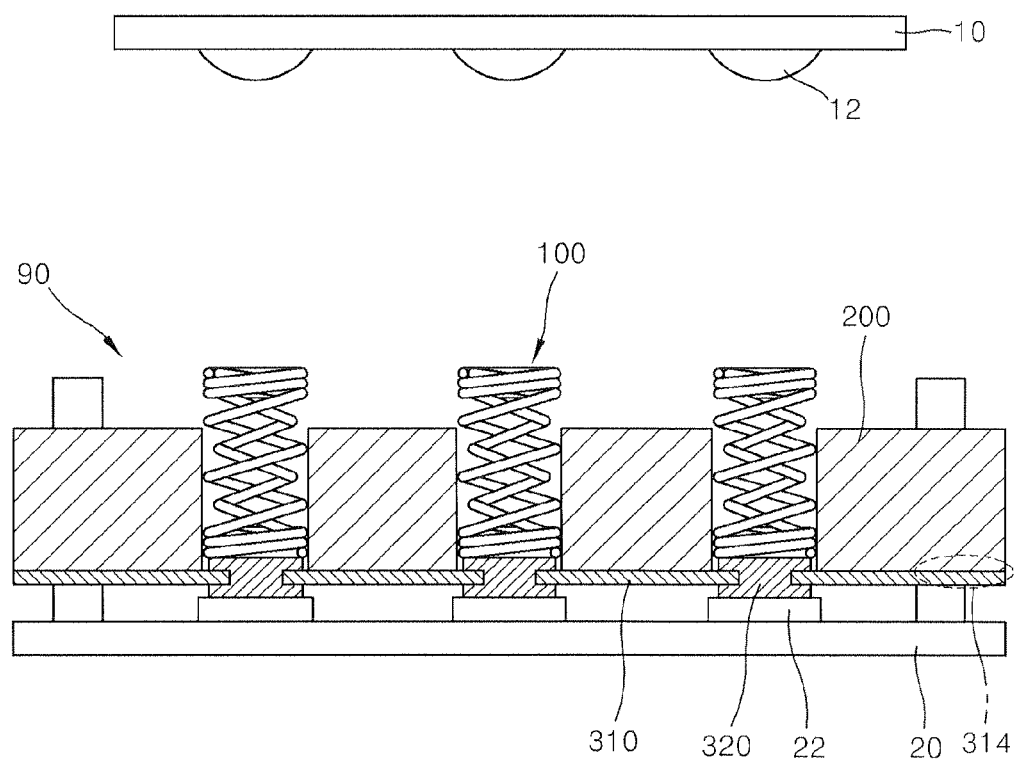
FIG. 8 is a cross-sectional view illustrating a test socket using spring assemblies, according to another embodiment of the present invention.

FIG. 8 is a cross-sectional view illustrating a test socket 90 according to another embodiment of the present invention.

Referring to FIG. 8, the test socket 90 includes a housing 200, spring assemblies 100, and a contact sheet. The housing 200 and the spring assemblies 100 are as described above, and thus, their detailed descriptions will be omitted herein.

The contact sheet includes conductive pads 320 and an insulating film 310. Materials and characteristics of the conductive pads 320 and the insulating film 310 are respectively the same as those of the conductive pads 320 and the insulating films 310 of the previous embodiment.

As shown in FIG. 8, the conductive pads 320 are formed narrower than diameters of through-holes of the housing 200, and thus, parts of bodies of the conductive pads 320 are inserted into the through-holes. Contact parts between the conductive pads 320 and the spring assemblies 100 may be soldered together.

Parts 314 of the insulating film 310 contacting the housing 200 may be combined with the housing 200 using an adhesive or fasteners, as shown in FIG. 8. In relation to a contact part, only ends of the insulating films 310 may be combined or soldered with the housing 200, as shown in FIG. 7, or all of the insulating film 310 contacting the housing 200 may be combined or soldered with the housing 200, as shown in FIG. 8.

The contact sheet is disposed on lower parts of the spring assemblies 100, i.e., between the test socket 90 and the test device 20, in FIG. 8, but may be disposed only on upper or lower parts of the spring assemblies 100 or on the upper and lower parts of the spring assemblies 100.

As described above, a test socket according to the present invention may be modified as follows. In the above-described embodiments, the contact sheet and the housing 200 are fixed to and combined with each other using an adhesive or an adhesive tape. However, the contact sheet and the housing 200 may not be fixed to each other.

Figure 9:
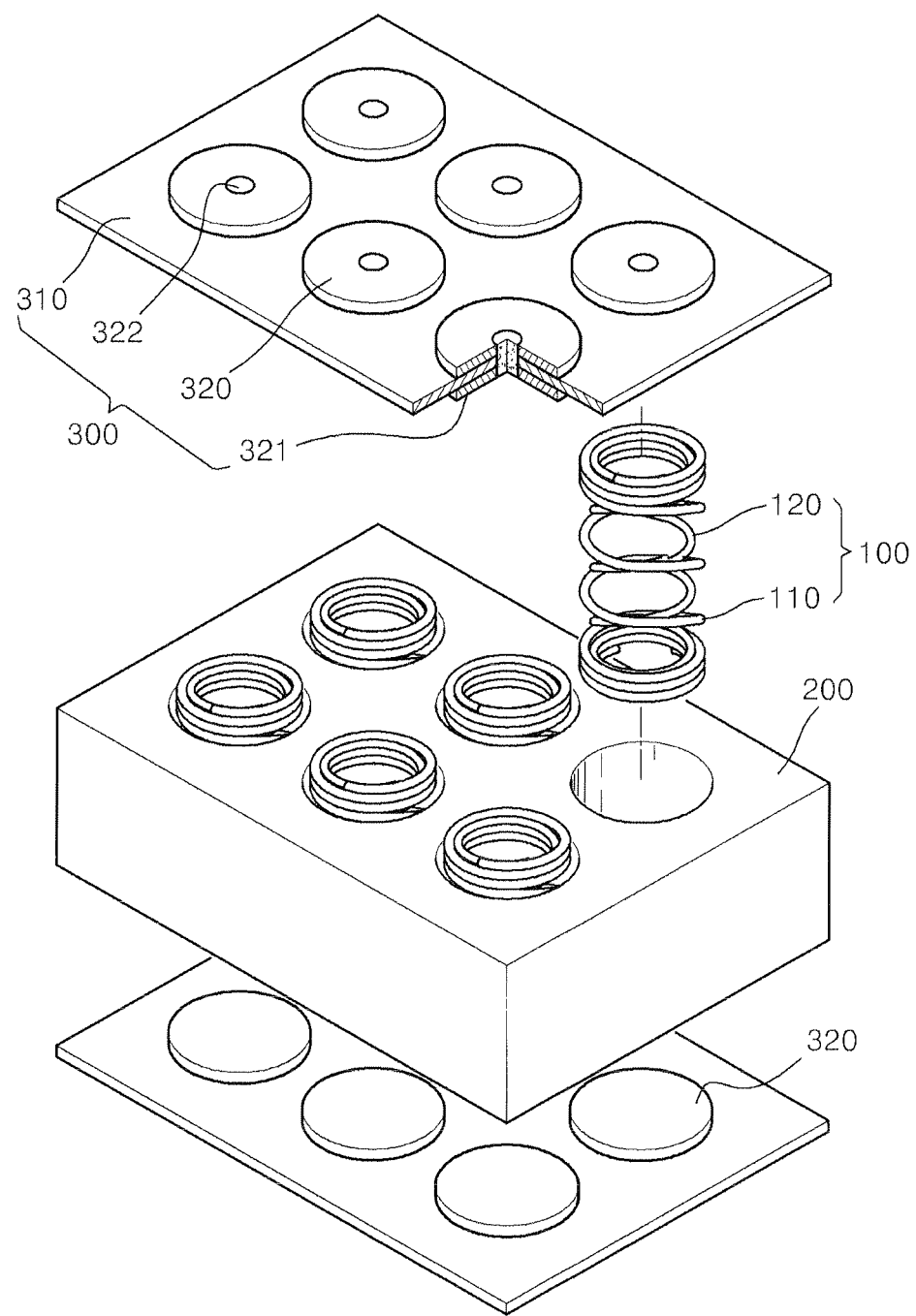
FIG. 9 is a perspective view illustrating a test socket according to an embodiment of the present invention.

FIG. 9 is a perspective view illustrating a test socket according to an embodiment of the present invention.

Spring assemblies 100 are inserted into through-holes of a housing 200, and a contact sheet is disposed on or underneath the spring assemblies 100 and thus contacts the spring assemblies 100.

The spring assemblies 100 include first springs 120 and second springs 110. The first springs 120 are formed as coils in an opposite direction to the second springs 110.

The contact sheet 300 includes upper and lower conductive pads 320 and 321 respectively arranged at positions at which the spring assemblies 100 are disposed and an insulating film 310 that supports the conductive pads 320.

The contact sheet 300 may be easily formed using the following method. The insulating film 310 is formed to have holes (not shown) formed in positions corresponding to the spring assemblies 100. The upper and lower conductive pads 321 having via-holes (not shown) and circular disk shapes are disposed respectively on and underneath the insulating film 310 based on the holes of the insulating film 310. The holes of the insulating film 310 and the via-holes of the upper and lower conductive pads 321 are filled with a metal or an alloy material having conductivity using a method such as soldering or the like, thereby completely forming the contact sheet 300. The formation of the contact sheet 300 is not limited to the above-described forming method, and the contact sheet 300 may be formed using various methods. Dual springs according to the present invention are used in a test socket which electrically connects lead terminals of a semiconductor chip to test terminals of a test device. The dual springs also respectively contact the lead terminals of the semiconductor chip and the test terminals of the test device to enable testing of the semiconductor chip. The dual springs have elasticity and electric conductivity and are inserted and disposed into a plurality of through-holes formed in a housing of the test socket to be described later.

MODE OF THE INVENTION

Spring assemblies and a test socket using the spring assemblies according to another embodiment of the present invention are as follows.

Figure 10:
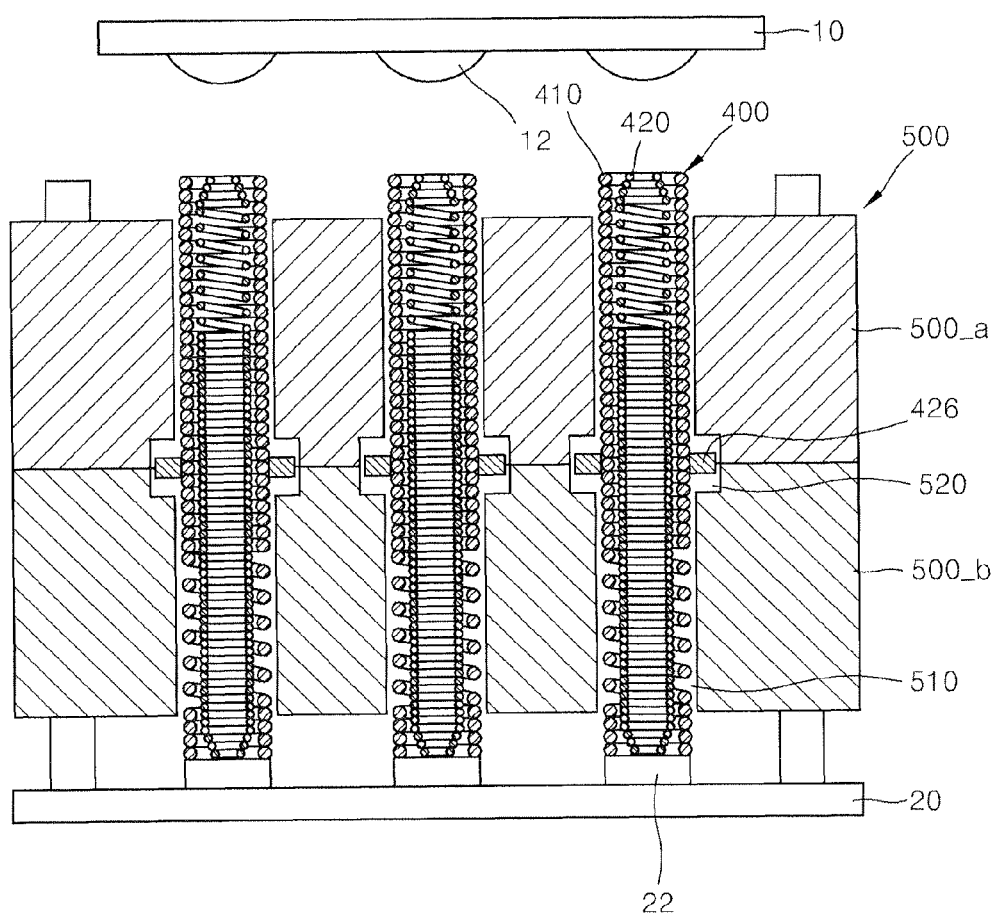
FIG. 10 is a cross-sectional view illustrating a test socket including spring assemblies according to another embodiment of the present invention.

FIG. 10 is a cross-sectional view illustrating a test socket 500 including spring assemblies 400 according to another embodiment of the present invention.

As shown in FIG. 10, the spring assemblies 400 according to the present embodiment are used in the test socket 500 to electrically connect lead terminals 12 of a semiconductor chip 10 to test terminals 22 of a test device 20. In more detail, if the lead terminals 12 of the semiconductor chip 10 press on the spring assemblies 400 of the test socket, the lead terminals 12 are electrically connected to the test terminals 22, thereby enabling testing of the semiconductor chip 10. The spring assemblies 400 have elasticity and electric conductivity and are inserted and disposed into a plurality of through-holes 510 formed in the housing of the test socket to be described below.

Referring to FIG. 10, the spring assemblies 400 include first springs 410 and second springs 420 which are inserted into the first springs 410.

The first and second springs 410 and 420 of the spring assemblies 400 may be formed of metal steel wires having high electric conductivity and elasticity such as Fe, Ni, or the like or alloy steel wires formed of various types of metal alloys.

Figure 11:
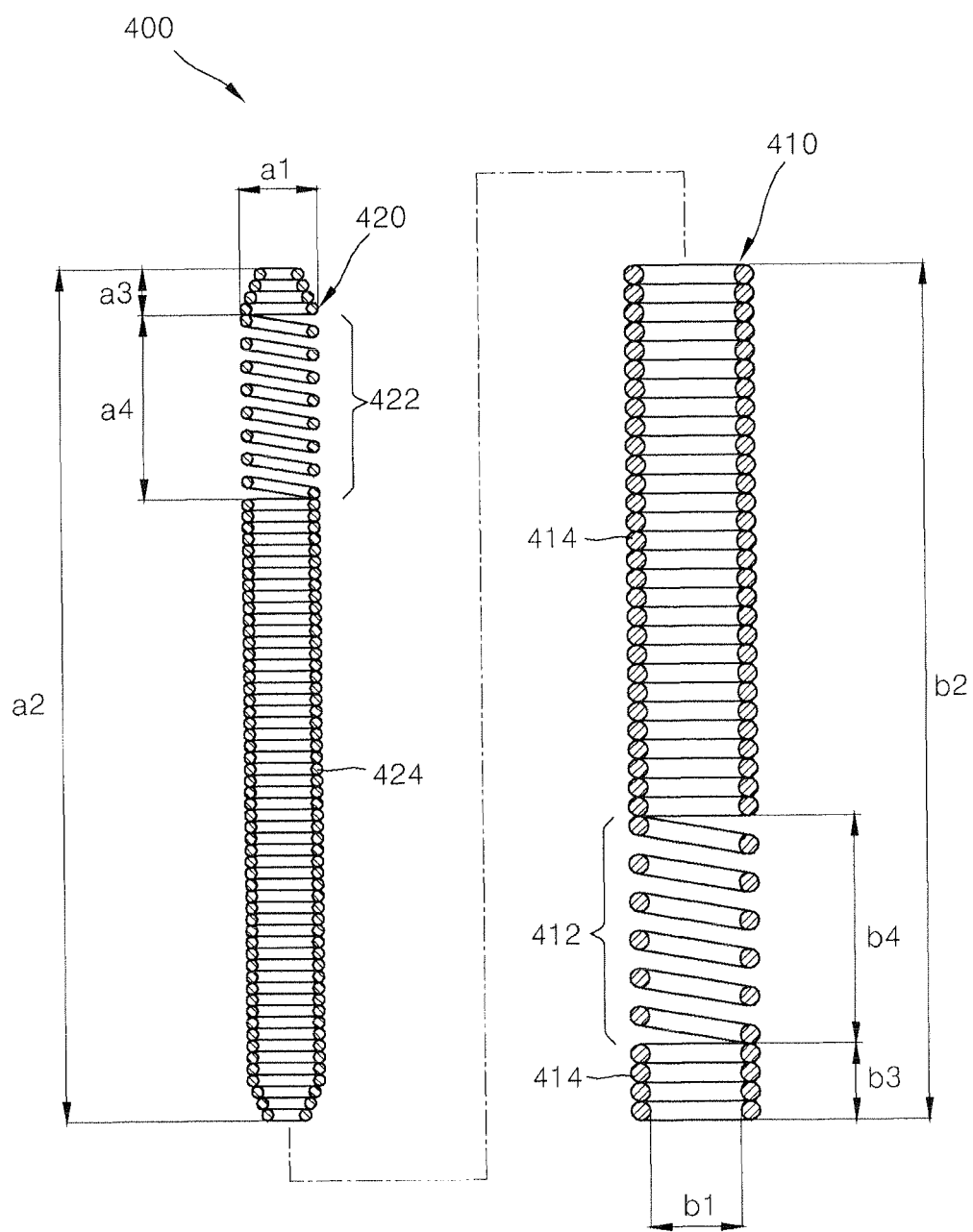
FIG. 11 illustrates a spring assembly in detail according to an embodiment of the present invention.

FIG. 11 illustrates a spring assembly 400 in detail according an embodiment of the present invention.

Referring to FIG. 11, the spring assembly 400 includes the first spring 410 and the second spring 420 which is inserted into the first spring 410.

For elasticity and electric conductivity, the first and second springs 410 and 420 are formed of thin metal steel wires or thin alloy steel wires having an elastic force. In other words, the metal steel wires or the alloy steel wires are coiled in one direction to form the first and second springs 410 and 420. Also, an outer diameter a1 of the second spring 420 is narrower than an inner diameter b1 of the first spring 410 so that the second spring 420 is insertable into the first spring 410. An outer diameter of the first spring 410 is narrower than an inner diameter of the through-hole 510 so that the spring assembly 400 is insertable into the through-hole 510 of the housing 500.

The first spring 410 includes a first contacting part 414 and a first elastic part 412.

The first contacting part 414 corresponds to a part in which a first steel wire is densely coiled without coil gaps so that coils contact one another. The first elastic part 412 corresponds to a part in which the first steel wire is coiled with coil gaps so that coils maintain fixed distances from one another.

The first spring 410 may have upper, middle, and lower parts having the same diameters. The first contacting part 414 and the first elastic part 412 of the first spring 410 respectively have similar structures and functions to a second contacting part 424 and a second elastic part 422 of the second spring 420 and thus are described below.

Metal steel wires used in the first and second springs 410 and 420, i.e., first and second steel wires, may have the same thicknesses or may have different thicknesses. If the second spring 420 is inserted into the first spring 410, and the first and second springs 410 and 420 having electric conductivity are compressed, the first and second steel wires only have to provide elasticity.

When the second spring 420 is inserted into the first spring 410, the second elastic part 422 faces the first contacting part 414, and the second contacting part 424 faces the first elastic part 412.

The second spring 420 includes the second contacting part 424 and the second elastic part 422.

The second contacting part 424 corresponds to a part in which the second steel wire is densely coiled without coil gaps so that coils contact one another. If the second steel wire is coiled with coil gaps, an inductance is generated. However, if the second steel wire is densely coiled without coil gaps between the coils, i.e., the coils contact one another, a current flows along contact points of the coils, and thus, the second contacting part 424 does not have an inductance. If a compressive force acts on the second contacting part 424, the second contacting part 424 does not have elasticity.

The second elastic part 422 corresponds to a part in which the second steel wire is coiled with coil gaps so that coils maintain fixed distances from one another. Since a current flows circularly in the second elastic part 422, the second elastic part 422 has an inductance. Also, if the second elastic part 422 is compressed by a compressive force, the second elastic part 422 has elasticity.

A length a4 of the second elastic part 422 may be shorter than half (50%) of a total length a2 of the second spring 420, and a length (a2-a4) of the second contacting part 424 may be longer than the length a4 of the second elastic part 422.

The second spring 420 may have upper, middle, and lower parts having the same diameters. However, the diameters of the upper and/or lower parts of the second spring 420 contacting the lead terminals 12 of the semiconductor chip 10 and/or the test terminals 22 of the test device 20 may be narrower than the diameter a1 of the middle part of second spring 420 so that the second spring 420 is easily inserted into the first spring 410. In other words, the second spring 420 may be formed in a varying shape.

Referring to FIG. 11, the second contacting part 424 is formed at the lower part of the second spring 420, and the elastic part 422 is formed at the upper part of the second spring 420. The first contacting part 414 is formed at the upper part of the first spring 410, and the first elastic part 412 is formed at the lower part of the first spring 410. The spring assembly 400 is formed so that when the second spring 420 is inserted into the first spring 410, the second elastic part 422 faces the first contacting part 414, and the second contacting part 424 faces the first elastic part 412.

Each of the first and second elastic parts 412 and 422 may be shorter than 50% of each of total lengths b2 and a2 of the first and second springs 410 and 420. Therefore, the second contacting part 424 may face the first contacting part 414 in a middle part of the spring assembly 400.

If the second contacting part 424 faces the first contacting part 414 in the middle part of the spring assembly 400, a compressive force acts on the spring assembly 400, and thus, the second spring 420 and the first spring 410 compress. Therefore, the second spring 420 is bent aside, and thus, the second contacting part 424 contacts the first contacting part 414.

The second contacting part 424 may be positioned at the upper part of the second spring 420, and the second elastic part 422 may be positioned at the lower part of the second spring 420. In this case, the first contacting part 414 of the first spring 410 may be positioned at the lower part of the first spring 410, and the first elastic part 412 may be positioned at the upper part of the first spring 410.

Referring back to FIG. 10, the second elastic parts 422 of the second springs 420 face the first contacting parts 414 of the first springs 410, and the second contacting parts 424 of the second springs 420 face the first elastic parts 412 of the first springs 410. Also, the second contacting parts 424 of the second springs 420 face the first contacting parts 414 of the first springs 410 in middle parts of the spring assemblies 400. However, all parts of the second contacting parts 424 do not need to face all parts of the first contacting parts 414. Also, when the spring assemblies 400 are compressed by the lead terminals 12, at least parts of the second contacting parts 424 may contact the first contacting parts 414. Here, the first springs 410 may be disposed to be close to the second springs 420 so that the first contacting parts 414 contact the second contacting parts 424.

Besides if the first contacting parts 414 contact the second contacting parts 424, when the first and second contacting parts 414 and 424 are compressed by the lead terminals 12, the second springs 420 may be disposed to be close to the first springs 410 so that at least parts of the second elastic parts 422 contact the first elastic parts 414. Even in this case, an electric signal is transmitted through the first contacting parts 414, thereby improving a signal transmission capability.

The spring assemblies 400 according to the present embodiment may be formed so that lengths of the second springs 420 are longer than lengths of the first springs 410. As will be described below, if the second springs 420 are longer than the first springs 410, the second contacting parts 424 contact the first contacting parts 414 in the middle parts of the spring assemblies 400 when the spring assemblies 400 are compressed due to testing of the semiconductor chip 10, thereby improving an electric signal transmission characteristic.

If the number of coiling of the first springs 410 is N1, and the number of coiling of the second springs 420 is N2, the numbers N1 and N2 may be N2≥N1. As the number of coiling of the second springs 20 having narrow outer diameters is greater than the number of coiling of the first springs 410, a signal transmission characteristic and an assembling characteristic are improved.

The second springs 420 of the spring assemblies 400 may be soldered to the first springs 420 at their upper and/or lower parts. Therefore, the second springs 420 are prevented from escaping from the first springs 410, and electric contact characteristics between the second springs 420 and the first springs 410 are improved at contact parts of the spring assemblies 400 with the lead terminals 12 and the test terminals 22.

The first springs 410 may be coiled in an opposite direction to that in which the second springs 420 are coiled. If the first and second springs 410 and 420 are formed in the opposite directions, inductances are offset from each other, thereby improving a signal transmission characteristic. Also, a pressure applied when testing the semiconductor chip 10 disperses in opposite directions, and thus durability of the spring assemblies 400 is improved, thereby maintaining shapes of the spring assemblies 400.

The first and second springs 410 and 420 may further include plating layers formed of at least one of Ni, Fe, Cu, Au, and Ag on surfaces of the first and second springs 410 and 420. Cu and Au may be sequentially plated on the surfaces of the first and second springs 410 and 420. Besides Au, various types of metals such as Ag or the like may be used as plating materials. A metal having high electric conductivity may be coated on the surfaces of the first or second springs 410 or 420 to improve the signal transmission characteristic.

The first springs 410 further include anti-escaping parts 426 which are formed on outer surfaces of the first springs 410 to prevent the first springs 410 from escaping from the through-holes 510 of the housing 500.

The anti-escaping parts 426 are formed on the outer surfaces of the first springs 410 and protrude in a perpendicular direction to a longitudinal direction of the first springs 410. To form the anti-escaping parts 426, a ring-shaped or doughnut-shaped metal or alloy may be soldered onto outer surfaces (outer surfaces of the middle parts of the spring assemblies 400) of the first contacting parts 414 or metal or alloy protrusions or projections may be soldered onto the outer surfaces of the first contacting parts 414.

The anti-escaping parts 426 are not limited to the above-described shapes and may be formed in any shapes which allow the spring assemblies 400 to be stopped by recesses 520 of the through-holes 510 of the housing 500 and thus not to escape from the through-holes 510.

Since the spring assemblies 400 transmit an electric signal through the second and first contacting parts 424 and 414 when testing the semiconductor chip 10, an effect of the inductance is reduced, thereby improving the signal transmission characteristic. If the coiling directions of the first and second springs 410 and 420 are opposite to each other, inductances generated by the first and second springs 410 and 420 are offset from each other, thereby reducing a whole inductance.

Since the spring assemblies 400 include only springs, the spring assemblies 400 occupy smaller areas than conventional pogo pins. If the spring assemblies 400 are arranged side-by-side at fixed distances from one another in a test socket, facing areas of the adjacent springs are reduced, thereby reducing capacitance.

When the spring assemblies 400 are compressed between the semiconductor chip 10 and the test device 20 due to testing of the semiconductor chip 10, the pressure disperses to the first and second springs 410 and 420. Therefore, durability of the first and second springs 410 and 420 is greater than when the spring assemblies 400 include one type of spring, thereby maintaining the shapes of the spring assemblies 400 for a long time.

Metal plating layers having high conductivity are formed on the surfaces of the first and second springs 410 and 420, thereby improving signal transmission characteristics of the spring assemblies 400.

The spring assemblies 400 quite freely adjust a height of the test socket 500 using the first and second springs 410 and 420 formed to desired lengths and the housing 500 to be described below. Also, since only plating is performed on the surfaces of the first and second springs 410 and 420 to form the spring assemblies 400 at a low cost, the spring assemblies 400 have a wide range of applications. For example, the spring assemblies 400 may be used instead of pogo pins in the test socket 500 to be described below or may be used instead of conventional springs inserted into barrels of the pogo pins. Therefore, the spring assemblies 400 have a variety of applications.

The test socket according to the present invention includes the spring assemblies 400 and the housing 500. The spring assemblies 400 are as described above, and thus, their detailed descriptions will be omitted herein.

The test socket mounted on the test device 20 is connected to the semiconductor chip 10 conveyed by the handler device or the like. In more detail, when the semiconductor chip 10 conveyed by the handler device or the like is moved down, and thus, the lead terminals 12 of the semiconductor chip 10 contact upper ends of the spring assemblies 400, the semiconductor chip 10 is pressed down by the pressurizer (not shown). Therefore, the lead terminals 12 of the semiconductor chip 10 are electrically connected to the test terminals 22 of the test device 20 via the spring assemblies 400.

The housing 500 supports the spring assemblies 400 and has the through-holes 510 formed in positions corresponding to the lead terminals 12 of the semiconductor chip 10 or the test terminals 22 of the test device 20. The housing 500 may be formed of FR4, FR5, bakelite, or an alloy resin material such as a PCB forming material or engineering plastic having high durability.

Upper and lower parts of the through-holes 510 formed in the housing 500 have the same diameters, and the through-holes 510 may be easily formed using a drill or the like.

The spring assemblies 400 are respectively inserted and disposed into the through-holes 510. Inner diameters of the through-holes 510 are wider than the outer diameters of the first springs 410 of the spring assemblies 400 so that the spring assemblies 400 are insertable into the through-holes 510 of the housing 500.

The spring assemblies 400 provide elasticity when compressed during the testing of the semiconductor chip 10 to improve contact thereof with the lead terminals 12 of the semiconductor chip 10 and the test terminals 22 of the test device 20. Also, even if positions or heights of the lead terminals 12 of the semiconductor chip 10 or the test terminals 22 of the test device 20 finely vary, the contacts of the spring assemblies 400 with the lead terminals 12 and the test terminals 22 are improved.

Referring to FIG. 10, the recesses 520 are formed in inner surfaces of the through holes 510 of the housing 500. The recesses 520 have wider diameters than the through-holes 510, and the anti-escaping parts 426 are stopped by the recesses 520, thereby preventing the spring assemblies 400 from escaping from the housing 500. The recesses 520 have depths deeper than predetermined lengths so that the anti-escaping parts 426 move up and down inside the recesses 520 in the longitudinal direction of the spring assemblies 400.

The housing 500 includes an upper housing 500_a and a lower housing 500_b combined with each other. The through-holes 510 respectively are formed in positions of the upper and lower housings 500_a and 500_b corresponding to the lead terminals 12 of the semiconductor chip 10. Also, the recesses 520 are symmetrically formed about parts of the through-holes 510 at which the upper and lower housings 500_a and 500_b attach to each other to have diameters wider than the through-holes 510 and depths deeper than predetermined lengths.

Figure 12:
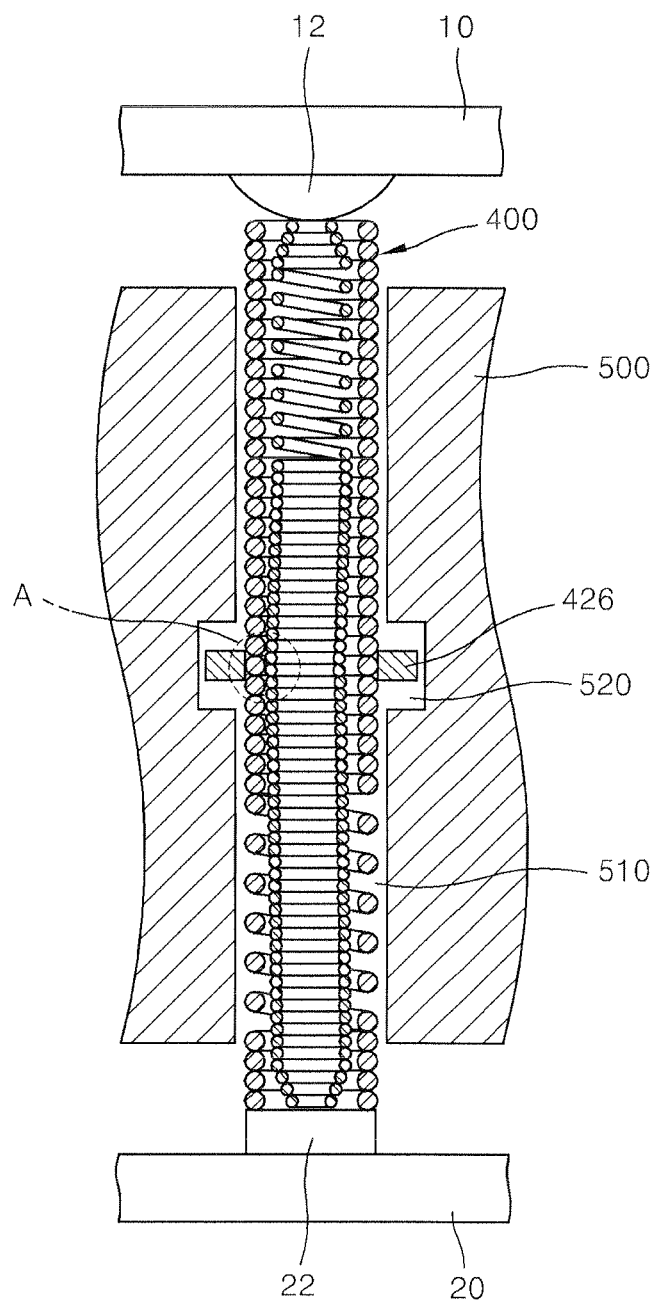
FIG. 12 illustrates an operation of the spring assembly of FIG. 11 when testing a semiconductor chip, according to an embodiment of the present invention.

FIG. 12 is a cross-sectional view illustrating an operation of the spring assembly 400 when the semiconductor chip 10 is tested, according to an embodiment of the present invention.

Referring to FIG. 12, when the semiconductor chip 10 is tested, the first and second springs electrically connect the lead terminal 12 of the semiconductor chip 10 to the test terminal 22 of the test device 20. When the semiconductor chip 10 is tested, the first and second springs 410 and 420 are respectively compressed and thus have elasticity, and a middle part of the second spring 420 is bent. Therefore, as indicated by A, a part of the second contacting contacts a part of the first contacting part.

Since the part of the second contacting part 424 contacts the part of the first contacting part 414 as indicated by A, an electric signal flows through the first contacting part 414 of the first spring 410 and the second contacting part 424 of the second spring 420. Accordingly, when the semiconductor chip 10 is tested, the spring assembly 400 provides elasticity and allows the electric signal to flow through contacting parts and not through elastic parts, thereby reducing an inductance. Also, since the spring assembly 400 includes two springs, namely, the first and second springs 410 and 420, durability of the spring assembly 400 is improved.

The length of the second spring 420 may be longer than the length of the first spring 410. Therefore, when the spring assembly 400 is compressed due to testing of the semiconductor chip 10, a part of the second spring 420, in particular, the part of the second contacting part 424, easily contacts the part of the first contacting part 414 of the first spring 410.

Figure 13:
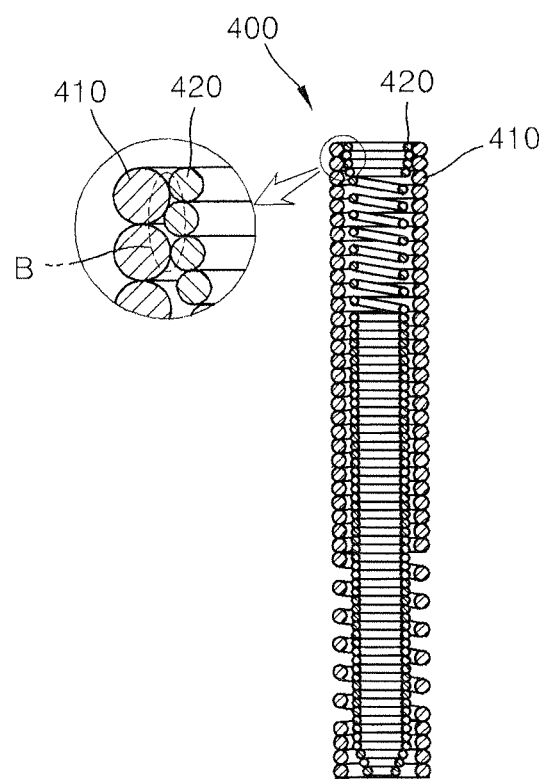
FIG. 13 illustrates a spring assembly according to another embodiment of the present invention.

FIG. 13 illustrates a spring assembly 400 according to another embodiment of the present invention.

As described above, the spring assembly 400 according to the present embodiment includes a first spring 410 and a second spring 420 inserted into the first spring 410.

Since an outer diameter of the second spring 420 is narrower than an inner diameter of the first spring 410, the second spring 420 may escape from the first spring 410. Therefore, the second spring 420 further includes an insertion part B formed at an upper part of the second spring 420 to have an outer diameter wider than the inner diameter b1 of the first spring 410.

An outer diameter of an upper part of the second spring 420 is wider than the inner diameter b1 of the first spring 410 as in the insertion part, the upper part of the second spring 420 is inserted into an upper part of the first spring 410, and an upper part of the second spring 420 is inserted into an upper part of first spring 410, thereby preventing the second spring 420 from escaping from the first spring 410. An outer diameter of a part of the second spring 420 except for the upper part of the second spring 420 is narrower than the inner diameter b1 of the first spring 410. Alternatively, the insertion part B may be formed at the lower part of the second spring 420. In this case, the lower part of the second spring 420 may be inserted into the lower part of the first spring 410 to form the spring assembly 110.

The prevention of the second spring 420 from escaping from the first spring 410 is not limited to the above-described structure. Upper or lower parts of the first and second springs 410 and 420 to be described below may be soldered together or a thin metal (not shown) may be inserted into a place of a first contacting part 414 of the first spring 410 to be inserted into a second contacting part 424 of the second spring 420. Therefore, the second spring 420 may not escape from the first spring 410 using various methods.

Figure 14:
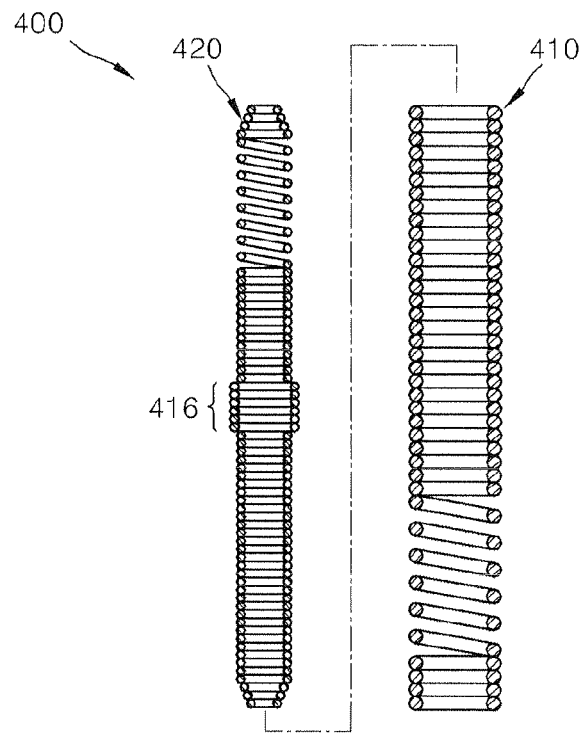
FIG. 14 illustrates a spring assembly according to another embodiment of the present invention.

FIG. 14 illustrates a spring assembly 400 according to another embodiment of the present invention.

Referring to FIG. 14, the spring assembly 400 includes a first spring 410 and a second spring 420 inserted into the first spring 410. Basic parts of the first and second springs 410 and 420 are as described above, and thus, their descriptions will be omitted herein.

A second contacting part 424 of the second spring 420 includes a protrusion part 116 has a wider diameter than other parts of the second contacting part 424. A first steel wire is coiled so that the protrusion part 116 has a wider diameter than the diameter a1 of the second contacting part 424 described above. An outer diameter (perpendicular to a longitudinal direction of a first contacting part) of the protrusion part 116 is narrower than an inner diameter of the first spring 410.

When the spring assembly 400 is compressed due to testing of a semiconductor chip, the protrusion part 116 of the second contacting part 424 easily contacts a first contacting part 414 of the first spring 410.

Figure 15:
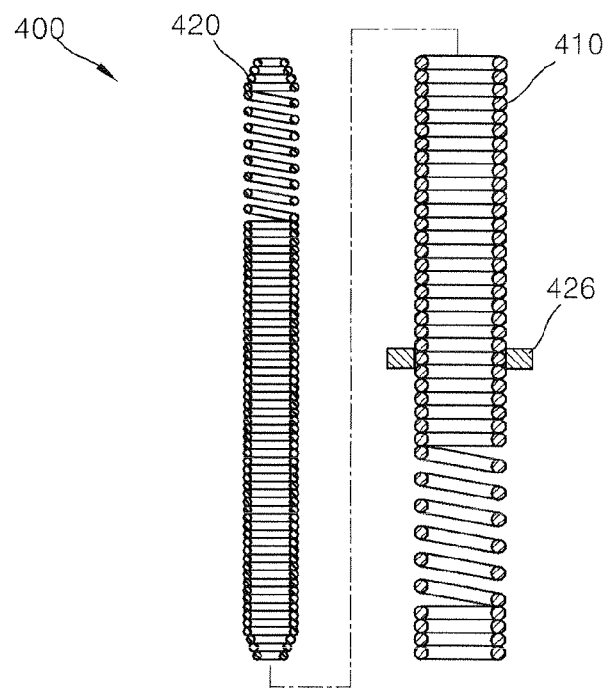
FIG. 15 illustrates a spring assembly according to another embodiment of the present invention.

FIG. 15 illustrates a spring assembly 400 according to another embodiment of the present invention.

A first spring 410 includes an anti-escaping part 426 which is formed on an outer surface of the first spring 410 to prevent the first spring 410 from escaping from a through-hole 510 of the housing 500.

The anti-escaping part 426 is formed on the outer surface of the first spring 410. The anti-escaping part 426 protrudes in a perpendicular direction to a longitudinal direction of the first spring 410. A ring-shaped or doughnut-shaped metal or alloy may be soldered onto a first contacting part 414 or metal or alloy protrusions or projections may be soldered onto the first contacting part 414 to form the anti-escaping part 426. The anti-escaping part 426 is not limited to the above shape and may be formed in any shape which allows the spring assembly 400 to be stopped by the recesses 520 of the through-hole 510 of the housing 500 and thus not to escape from the through-hole 510.

Figure 16:
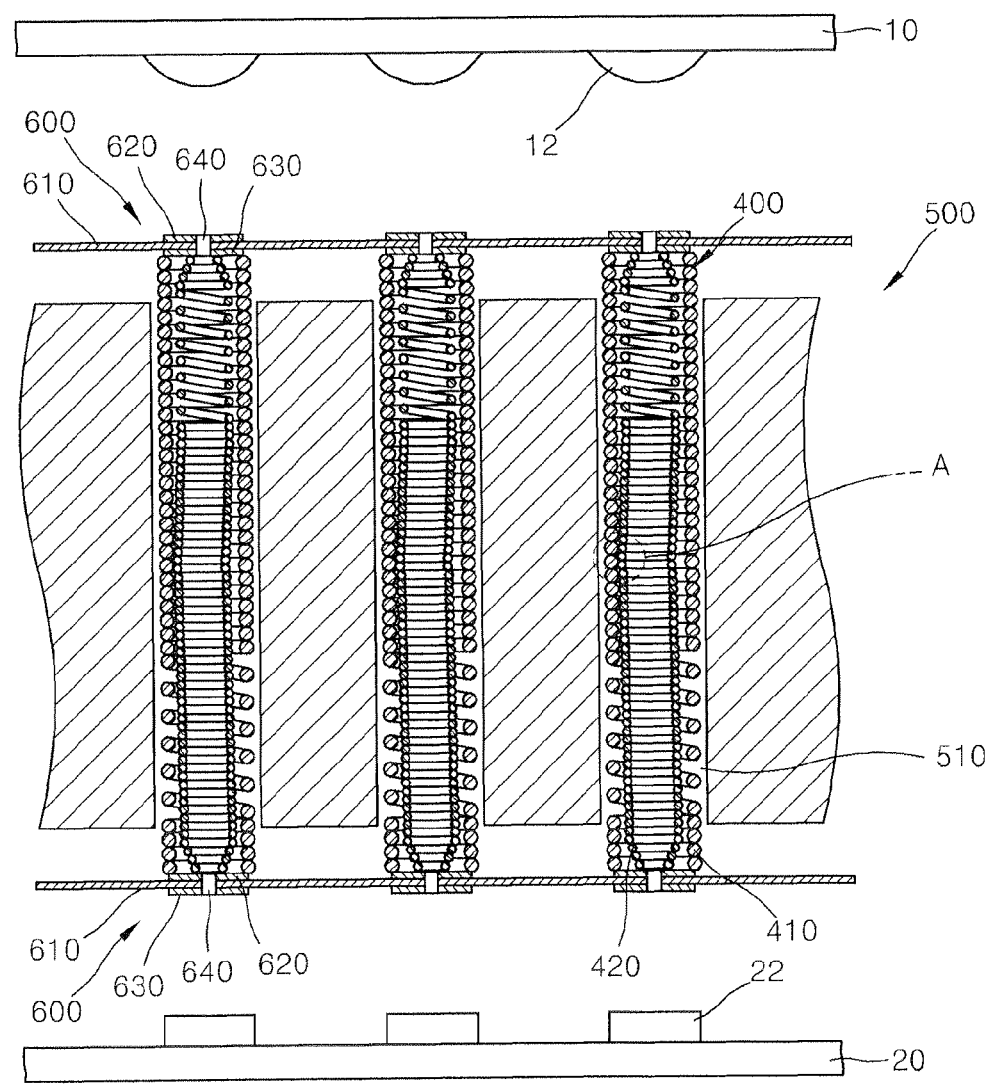
FIG. 16 is a cross-sectional view illustrating a test socket according to another embodiment of the present invention.

FIG. 16 is a cross-sectional view illustrating a test socket according to another embodiment of the present invention.

Referring to FIG. 16, the test socket according to the present embodiment includes spring assemblies 400, a housing 500, and contact sheets 600. The spring assemblies 400 and the housing 500 are as described above, and thus, their detailed descriptions will be omitted herein.

The contact sheets 600 are disposed between the spring assemblies 400 and a semiconductor chip 10 and/or the spring assemblies 400 and a test device 20 and include conductive pads 620 and 630 and insulating films 610.

The insulating films 610 have a plurality of holes (not shown) formed in positions corresponding to the spring assemblies 400 so that the conductive pads 620 and 630 are arranged in the holes. The insulating films 610 may be formed of a synthetic resin material such as polypropylene, polyethylene, or the like.

The conductive pads 620 and 630 are arranged in the holes of the insulating films 610 formed in the positions corresponding to the spring assemblies 400, i.e., positions corresponding to positions in which through-holes 510 of the housing 500 are formed. Therefore, the conductive pads 620 and 630 contact the spring assemblies 400 and electrically connect lead terminals 12 of the semiconductor chip 10 to test terminals 22 of the test device 20.

The conductive pads 620 and 630 may be formed of various types of metals having high electric conductivity and in structures in which Ni and Au plating layers are formed on Cu-clad films. Plating layers may be formed of at least one of Ni, Fe, Cu, Au, Al, and Ag on surfaces of the conductive pads 620 and 630 to improve electric conductivity. Alternatively, plating layers may be formed of various types of metals or alloy materials having high conductivity.

Contact parts between the conductive pads 620 and 630 and the spring assemblies 400 are electrically connected to one another and may be soldered together. Due to this soldering, electric contact characteristics between the conductive pads 620 and 630 and the spring assemblies 400 are improved, and the spring assemblies 400 are prevented from escaping from the through-holes 510 of the housing 500. However, the conductive pads 620 and 630 and the spring assemblies 400 may simply contact one another without being soldered together.

As described above, lengths of second springs 420 of the spring assemblies 400 may be longer than lengths of first springs 410. If the lengths of the second springs 420 are longer than the lengths of the first springs 410, and the first springs 410, the second springs 420, the conductive pads 630 are soldered together, second contacting parts 424 of the second springs 420 contact first contacting parts 414 of the first springs 410 at location A of FIG. 16. If the lengths of the second springs 420 are equal to the lengths of the first springs 410, and the spring assemblies 400 are compressed, parts of the second contacting parts 424 contact parts of first contacting parts 414.

Diamond powder and/or Ni powder (not shown and referred to as diamond powder, etc.) may be coated on surfaces of parts of the conductive pads 620 and 630 contacting the lead terminals 12 and/or the test terminals 22. In more detail, the diamond powder, etc., is plated and attached to surfaces of the conductive pads 620 and 630 due to plating layers formed of Ni or a metal having high electric conductivity.

If the diamond powder, etc., is coated on the conductive pads 620 and 630, Ni or metal powder having high electric conductivity along with the diamond powder, etc., may be coated and plated on the surfaces of the conductive pads 620 and 630 to improve electric conductivity.

Even if foreign substance layers (not shown) are formed on the lead terminals 12 of the semiconductor chip 10 or the test terminals 22 of the test device 20 due to coating of the diamond powder, etc., on the surfaces of the conductive pads 620 and 630, the diamond powder, etc., may break the foreign substance layers formed on the lead terminals 12 and the test terminals 20 or the spring assemblies 400. Therefore, the lead terminals 12 and the test terminals 22, from which the foreign substance layers have been removed by the diamond powder, etc., pass through the diamond powder and contact the surfaces of the conductive pads 620 and 630, thereby greatly reducing an electric resistance.

Each of the particle diameters of the diamond powder, etc., may be between about 0.1 μm and about 50.0 μm. If each of the particle diameters is smaller than 0.1 μm, the diamond powder, etc., may not break the foreign substance layers. If each of the particle diameters is greater than 50.0 μm, the diamond powder, etc., may damage surfaces of the lead terminals 12 and the test terminals 22.

The contact sheets 600 are positioned on and underneath the spring assemblies 400 in FIG. 16 but may be positioned only on or underneath the spring assemblies 400 or on and underneath the spring assemblies 400.

The conductive pads 620 and 630 may be soldered onto the first springs 410 and the second springs 420 at contact parts between the conductive pads 620 and 630 of the contact sheets 600 and the spring assemblies 400. Edges (ends) (not shown) of the insulating films 610 may be combined or joined with the housing 500 using a method such as adhering or fastening. The insulating films 610 may be combined or joined with the housing 500 using various methods.

In the contact sheets 600 according to the present embodiment, the conductive pads 620 contacting the lead terminals 12 of the semiconductor chip 12 or the test terminals 22 of the test device 20 are connected to one another through the insulating films 610. Thus, the foreign substance formed on the lead terminals 12 of the semiconductor chip 10 or the test terminals 22 of the test device 20 do not enter the through-holes 510 of the housing. Also, left and right positions of the conductive pads 620 and 630 are uniformly maintained by the insulating films 610. If cross-sectional areas of the conductive pads 620 and 630 which respectively contact the lead terminals 12 or the test terminals 22 are increased, surface areas of the conductive pads 620 and 630 which respectively contact the lead terminals 12 or the test terminals 22 are increased. Therefore, the conductive pads 620 and 630 are electrically connected to the lead terminals 12 or the test terminals 22, and the spring assemblies 400 are prevented from escaping from the through-holes 510 of the housing 500.

The contact sheets 600 may be simply formed using the following method. The insulating films 610 having holes (not shown) in positions corresponding to the spring assemblies 400 are provided. The upper conductive pads 620 and the lower conductive pads 630 having via-holes 640 and circular disk shapes are respectively positioned at upper and lower parts of the insulating films 610 based on holes of the insulating films 610. A metal or alloy material having conductivity is filled into the holes of the insulating films 610 and the via-holes 640 of the upper and lower conductive pads 620 and 630 to form the contact sheets 600.

The insulating films 610 are provided, and the upper and lower conductive pads 620 and 630 having the circular disk shapes are adhered to positions corresponding to the spring assemblies 400. The via-holes 640 are formed in centers of the upper and lower conductive pads 620 and 630 to pass through the insulating films 610. The upper and lower conductive pads 620 and 630 are plated using a metal or alloy material having electric conductivity to form the contact sheets 600 which include the upper and lower conductive pads 620 and 630 electrically connected to one another. The contact sheets 600 are not limited to the above-described forming methods and may be formed using various methods.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. Spring assemblies used in a test socket and compressed when lead terminals of a semiconductor chip press the spring assemblies, to electrically connect the lead terminals of the semiconductor chip to test terminals of a test device, comprising:
    first springs in which a first steel wire having conductivity is coiled in a spiral and which comprise first contacting parts in which the first steel wire is densely coiled so that coils thereof contact one another and first elastic parts in which the first steel wire is coiled so that coils thereof maintain distances from one another; and
    second springs in which a second steel wire having conductivity is coiled in a spiral and which comprise second contacting parts in which the second steel is coiled so that coils thereof contact one another and second elastic parts in which the second steel wire is coiled so that coils thereof maintain distances from one another,
    wherein the first springs are inserted into the second springs,
    and wherein the first contacting parts face the second elastic parts, and the first elastic parts face the second contacting parts, and
    wherein when the spring assemblies are compressed by the lead terminals, the second springs are disposed to be close to the first springs so that at least parts of the second contacting parts contact the first contacting parts.

2. Spring assemblies used in a test socket and compressed when lead terminals of a semiconductor chip press the spring assemblies, to electrically connect the lead terminals of the semiconductor chip to test terminals of a test device, comprising:
    first springs in which a first steel wire having conductivity is coiled in a spiral and which comprise first contacting parts in which the first steel wire is densely coiled on that coils thereof contact one another and first elastic parts in which the first steel wire is coiled so that coils thereof maintain distances from one another; and
    second springs in which a second steel wire having conductivity is coiled in a spiral and which comprise second contacting parts in which the second steel is coiled so that coils thereof contact one another and second elastic parts in which the second steel wire is coiled so that coils thereof maintain distances from one another,
    wherein the first springs are inserted into the second springs,
    and wherein the first contacting parts face the second elastic parts, and the first elastic parts face the second contacting parts, and
    wherein when the spring assemblies are compressed by the lead terminals, the second springs are disposed to be close to the first springs so that at least parts of the second elastic parts contact the first contacting parts.

3. Spring assemblies used in a test socket and compressed when lead terminals of a semiconductor chip press the spring assemblies, to electrically connect the lead terminals of the semiconductor chip to test terminals of a test device, comprising:
    first springs in which a first steel wire having conductivity is coiled in a spiral and which comprise first contacting parts in which the first steel wire is densely coiled so that coils thereof contact one another and first elastic parts in which the first steel wire is coiled so that coils thereof maintain distances from one another; and
    second springs in which a second steel wire having conductivity is coiled in a spiral and which comprise second contacting parts in which the second steel is coiled so that coils thereof contact one another and second elastic parts in which the second steel wire is coiled so that coils thereof maintain distances from one another,
    wherein the first springs are inserted into the second springs,
    and wherein the first contacting parts face the second elastic parts, and the first elastic parts face the second contacting parts, and wherein the first and second springs are soldered together at least one of upper and lower parts of the first and second springs.

4. The spring assemblies of any one of claims 1, 2 and 3, wherein the second springs further comprise insertion parts at least one of upper and lower parts of the second springs, wherein outer diameters of at least one of the upper and lower parts are wider than inner diameters of the first springs.

5. A test socket comprising the spring assemblies of any one of claims 1, 2 and 3, comprising:
    a housing which comprises a plurality of through-holes formed in positions corresponding to the lead terminals and supports the spring assemblies inserted into the through-holes.

6. The test socket of claim 5, wherein the first springs further comprise anti-escaping parts which are formed on outer surfaces of the first springs to prevent the first springs from escaping from the housing, wherein the housing comprises recesses which are formed in inner surfaces of the through-holes to prevent the spring assemblies from escaping from the housing.

7. The test socket of claim 5, further comprising a contact sheet disposed between the test socket and the semiconductor chip or between the test socket and the test device, wherein the contact sheet comprises conductive pads which contact the spring assemblies; and an insulating film which supports the conductive pads so that the conductive pads are arranged at positions corresponding to the spring assemblies, wherein the conductive pads are electrically connected to the spring assemblies.

8. The test socket of claim 7, wherein the conductive pads and the spring assemblies are soldered together.

9. The test socket of claim 5, wherein at least one of diamond powder and Ni powder is coated on surfaces of parts of the conductive pads contacting the lead terminals or the test terminals.

10. The spring assemblies of claim 1 or 2, wherein lengths of the second springs are longer than lengths of the first springs.

11. The spring assemblies of any one of claims 1, 2 and 3, wherein when the number of coiling of the first springs is N1, and the number of coiling of the second springs is N2, the numbers N1 and N2 are N2≧N1.

12. The spring assemblies of any one of claims 1, 2 and 3, wherein the second contacting parts comprise protrusion parts having wider diameters than other parts thereof.

13. The spring assemblies of any one of claims 1, 2 and 3, wherein at least one of the first and second springs further comprises plating layers formed of at least one of Ni, Fe, Cu, Au, and Ag on surfaces of the at least one of the first and second springs.

14. The spring assemblies of any one of claims 1, 2 and 3, wherein the first and second springs are coiled in a spiral in opposite directions.

* * * * *